US012563858B2

(12) United States Patent
Giacomini

(10) Patent No.: US 12,563,858 B2
(45) Date of Patent: Feb. 24, 2026

(54) THREE DIMENSIONAL CONCAVE HEMISPHERE SOLAR CELLS

(71) Applicant: David O. Giacomini, Raleigh, NC (US)

(72) Inventor: David O. Giacomini, Raleigh, NC (US)

( * ) Notice: Subject to any disclaimer, the term of this patent is extended or adjusted under 35 U.S.C. 154(b) by 0 days.

(21) Appl. No.: 18/033,412

(22) PCT Filed: Oct. 25, 2021

(86) PCT No.: PCT/US2021/056523
§ 371 (c)(1),
(2) Date: Apr. 24, 2023

(87) PCT Pub. No.: WO2022/087543
PCT Pub. Date: Apr. 28, 2022

(65) Prior Publication Data
US 2024/0021743 A1 Jan. 18, 2024

Related U.S. Application Data

(60) Provisional application No. 63/105,344, filed on Oct. 25, 2020.

(51) Int. Cl.
| | |
|---|---|
| H10F 77/14 | (2025.01) |
| H10F 19/30 | (2025.01) |
| H10F 19/80 | (2025.01) |
| H10F 77/30 | (2025.01) |
| H10F 77/70 | (2025.01) |

(52) U.S. Cl.
CPC ........... H10F 77/147 (2025.01); H10F 19/30 (2025.01); H10F 19/80 (2025.01); H10F 77/315 (2025.01); H10F 77/703 (2025.01)

(58) Field of Classification Search
CPC .... H10F 77/703; H10F 77/147; H10F 77/315; H10F 19/30; H10F 19/80
See application file for complete search history.

(56) References Cited

U.S. PATENT DOCUMENTS

| | | | | |
|---|---|---|---|---|
| 2005/0022860 | A1* | 2/2005 | Toh ........................ | H10F 77/147 136/251 |
| 2015/0037923 | A1* | 2/2015 | Tarasov .................. | H10F 77/10 438/71 |

OTHER PUBLICATIONS

Monteiro et al. "Surface Texturing with Hemispherical Cavities to Improve Efficiency in Silicon Solar Cells". International Journal of Photoenergy. vol. 2012, Article ID 743608, 7 pages. (Year: 2012).*

* cited by examiner

*Primary Examiner* — Lindsey A Buck
(74) *Attorney, Agent, or Firm* — John Ryan C. Wood; Wood Patent Law

(57) ABSTRACT

Three dimensional concave hemisphere solar structures are provided. A photovoltaic solar cell substrate has a light receiving surface and a back surface opposite the light receiving surface. The photovoltaic solar cell substrate light receiving surface has a plurality of gas filled concave hemisphere cavities having a depth and a radius of one millimeter or greater. A substantially planar transparent cover seals the plurality of gas filled concave hemisphere cavities.

20 Claims, 11 Drawing Sheets

THREE DIMENSIONAL CONCAVE HEMISPHERE SOLAR CELLS

CROSS-REFERENCE TO RELATED APPLICATIONS

This application is a U.S. National Stage of International Application No. PCT/US21/56523 filed Oct. 25, 2021 which claims the benefit of U.S. Provisional Patent Application Ser. No. 63/105,344 filed Oct. 25, 2020, all of which are hereby incorporated by reference in their entirety.

FIELD

This disclosure relates generally to the design and manufacture of photovoltaic solar cells and modules. More specifically, this disclosure is related to the design and manufacture of photovoltaic solar cells and panels with concave hemisphere cavity light receiving surface structures.

BACKGROUND

Advances in photovoltaic technology and efficiency have increased the adoption of solar panels. As photovoltaic energy production efficiency continues to improve, the cost-benefit ratio has made solar energy an increasingly viable source of energy capture. And as the cost of photovoltaic solar cells, modules, and panels continues to decline, the cost of installation, including land costs, has become a primary factor in the decision to implement solar capture. However as solar adoption increases, surface areas available for installing solar panels, for example land and rooftops, have become more limited due to physical limitations, non-ideal angles, and costs. In other words, surface areas for the installation of solar panels are becoming increasingly difficult to both locate and utilize due to costs and the direction to the sun.

With respect to sun angle for instance, for a home installation a south facing roof solar panel installation angled at thirty to forty degrees slope is ideal; however, this dramatically limits the options to maximize solar energy capture.

Relating to surface area space availability, for instance a standard installation of a photovoltaic panel, a panel being at least one solar module and a module being at least one solar cell, often includes a standard two-dimensional array of panels (e.g., each module having a size of approximately 39"×65") and in many cases, there is not enough direct sunlit surface area to install enough solar panels to generate adequate energy needs regardless of sunlight exposure and angle.

SUMMARY

According to one aspect of the disclosed subject matter, a photovoltaic solar structure is provided. A photovoltaic solar cell substrate has a light receiving surface and a back surface opposite the light receiving surface. The photovoltaic solar cell substrate light receiving surface has a plurality of gas filled concave hemisphere cavities having a depth and a radius of one millimeter or greater. A substantially planar transparent cover seals the plurality of gas filled concave hemisphere cavities.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages that are included within this description, be within the scope of any claims.

BRIEF DESCRIPTION OF TIDE FIGURES

The features, natures, and advantages of the disclosed subject matter may become more apparent from the detailed description set forth below when taken in conjunction with the drawings in which like reference numerals indicate like features.

DESCRIPTION

Figures 1A, 1B, 1C, 1D:
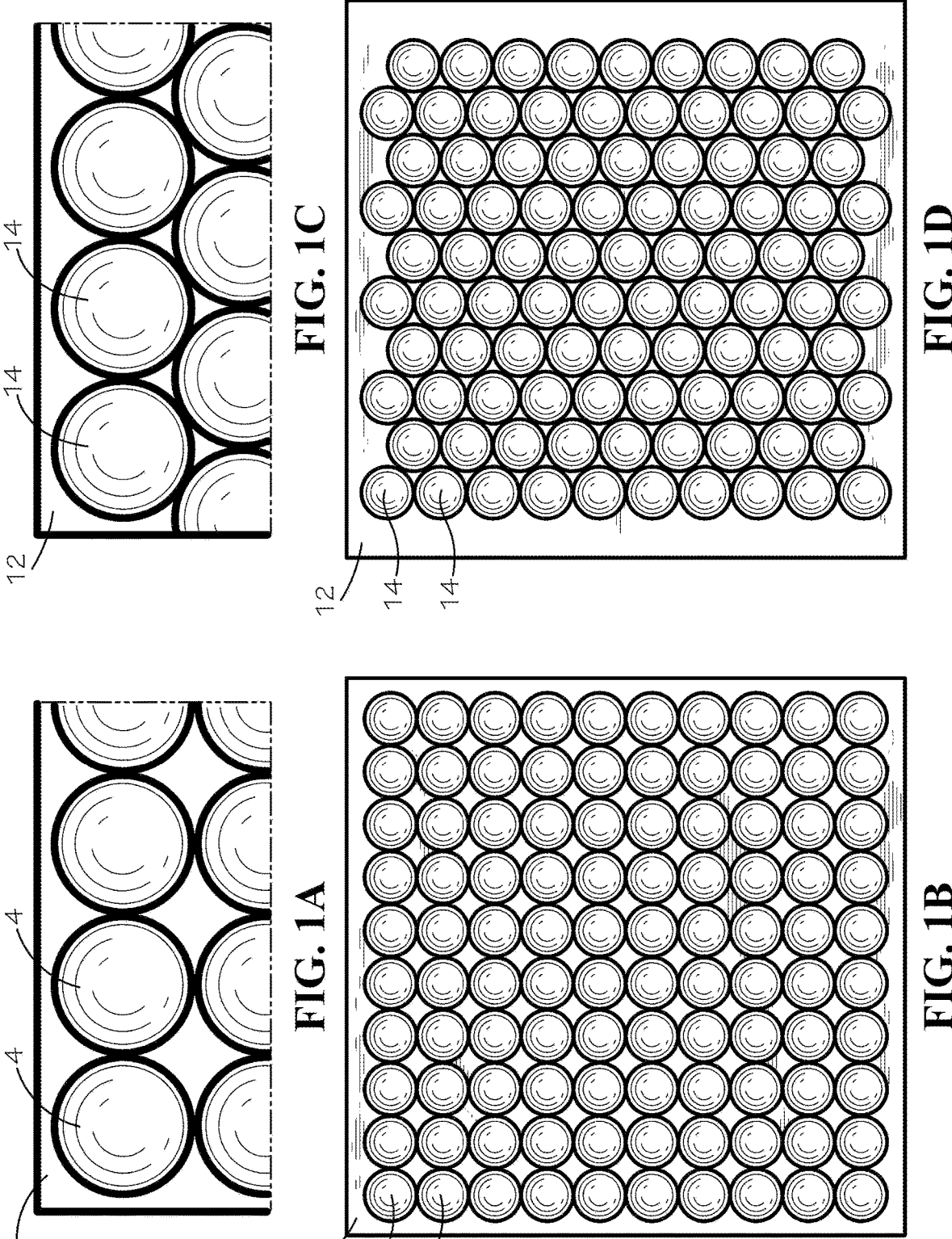
FIGS. 1A and 1B are top views of a photovoltaic solar structure embodiment.
FIGS. 1C and 1D are top views of a photovoltaic solar structure embodiment.

The following description is not to be taken in a limiting sense, but is made for the purpose of describing the general principles of the present disclosure. The scope of the present disclosure should be determined with reference to the claims. Exemplary embodiments of the present disclosure may be illustrated in the drawings, like numbers being used to refer to like and corresponding parts of the various drawings. The dimensions of drawings provided are not shown to scale.

The present application provides a photovoltaic solar structure having a photovoltaic surface with concave three-dimensional hemisphere cavity structures covered with a transparent front cover (e.g., an anti-reflective cover). The concave hemisphere structure—concave with respect to the light receiving side of the solar cell—significantly increases the light receiving surface area of photovoltaic material through added depth while having the same area footprint, and the curvature of the concave hemispheres maximizes capture of solar energy at varying angles. In other words, both light receiving surface area and sun angle capture are improved, and increased.

Using a structural solar panel having depth to maximize surface area and concave hemispheres to reflect sunlight at various angles, allows solar installers to gain significant flexibility in choosing install locations. Homeowners are better able to capture sunlight from non-south facing rooftop locations or non-ideal roof sloping angles. And solar farms are able to incorporate greater photovoltaic capture surface area on the same amount of acreage. The additional capture area for the same given space is increased by approximately 75%—resulting in a significantly improved land cost vs. solar panel ratio. For example, if the available surface area for a rooftop solar installation is 50'×20'=600 sq ft., the concave hemisphere cavity solution provided increases the surface area of the light receiving photovoltaic semiconductor surface by 78.5%, or the equivalent of a 1,071 sq. ft. roof, as compared to a planar light receiving photovoltaic semiconductor surface. Or for example, 600 acres of land may yield the equivalent of 1,071 acres of land.

The concave hemisphere solutions provided have a three dimensional structure, which is described as a cavity like structure, including a three dimensional depth in stark contrast and difference of structure and manufacturing to known textured and particularly nano-textured photovoltaic solar cells. The depth of the hemispheres is crucial for adding surface area and. capturing light. Depth is described here in the context of the radius/one half diameter of the concave hemisphere/half sphere. The concave hemisphere diameter limits are in the range from 1 mm-100 mm and the most common range is 2 mm-10 mm. Considerations include the smoothness of the deposited surface desired. Evenly/uniform deposited layers may be more readily manufacturable with larger hemispheres sizes, particularly hemispheres having a diameter of at least 6 to 8 mm. An exemplary embodiment being the 4 mm diameter concave hemisphere cavities shown in FIG. 2.

Importantly, the concave hemisphere cavity shape maximizes surface area and, unlike texturing that randomly scatters light to improve capture, the curvature of the hemisphere structure intentionally bounces light at specific controlled angles to maximize light capture.

Importantly, the relatively large dimensions of the concave hemisphere cavities allow for the formation of a smooth and curved light receiving surface ideal for light capture and light bouncing without the need for surface texturing. And particularly, the large hemisphere cavity solutions described allow for an even and smooth surface deposition, or coating, of photovoltaic thin film material on a base substrate mold.

And importantly, the concave hemisphere cavities are gas filled. The relatively large dimensions of the concave hemisphere cavities allow for the introduction of gas (e.g., air) and the improvement and optimization of solar cell efficiency. The term "ambient air" is intended to refer to uncontaminated air such as air in a cleanroom with a low level of pollutants and a low humidity.

A solar cell and photovoltaic panel solution having three dimensional features with additional depth may increase surface area for light absorption. The solar cell and PV panel solutions described provide concave hemispheres to create depth to maximize sunlight capture at a variety of sunlight angles throughout daylight hours.

FIGS. 1A and 1B are top views of a photovoltaic solar structure having a three-dimensional hemisphere cavity linear pattern and FIGS. 1C and 1D are top views of a photovoltaic solar structure having a three-dimensional hemisphere cavity staggered pattern. Concave hemisphere cavities 4 are in the front light receiving surface of photovoltaic structure 2 in a linear pattern. Concave hemisphere cavities 14 are in the front light receiving surface of photovoltaic structure 12 in a staggered, or offset, pattern.

Figure 2:
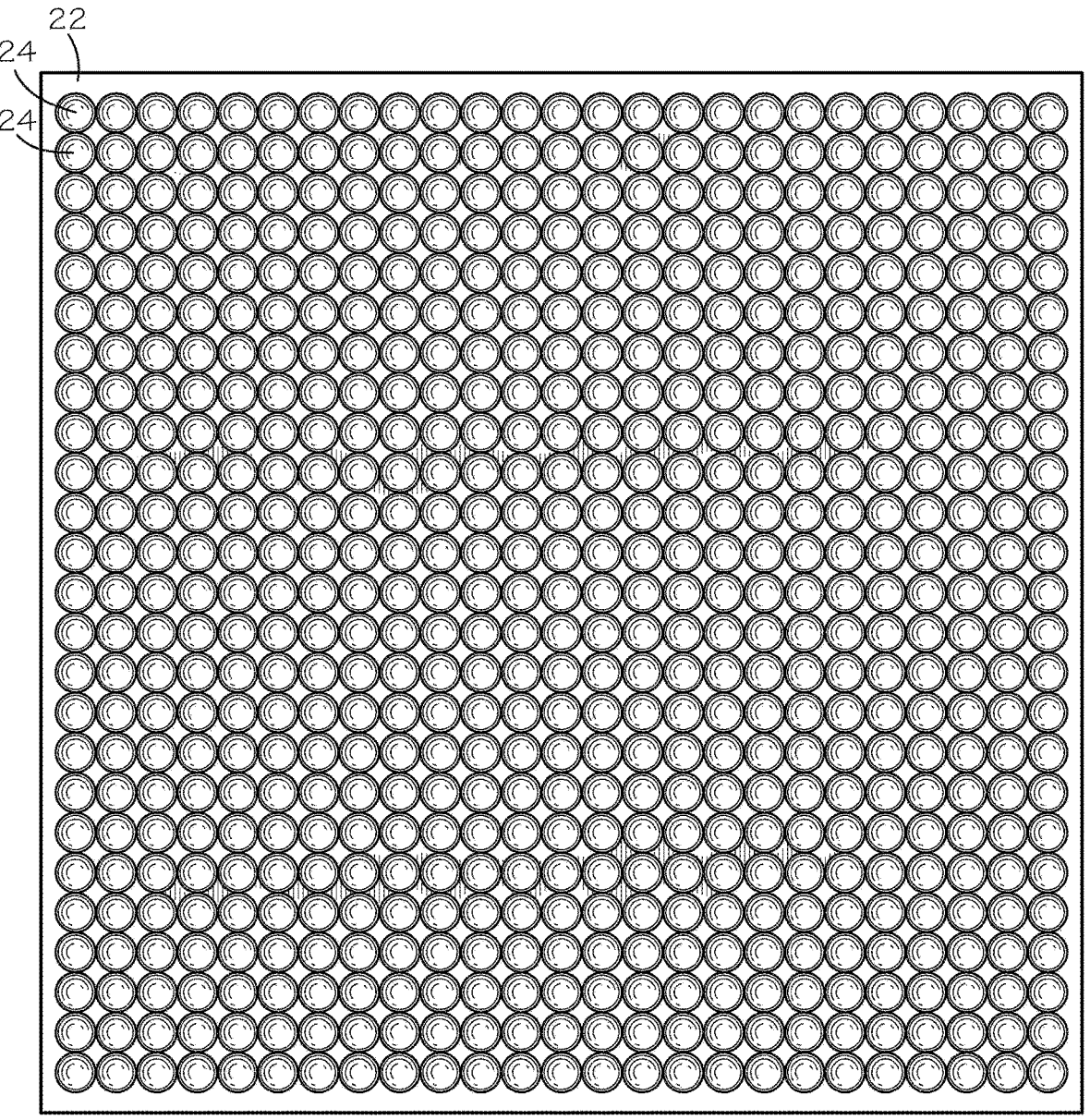
FIG. 2 is a top view of a solar s c embodiment.

FIG. 2 is a top view of a 100 mm by 100 mm photovoltaic solar structure having a linear pattern of three-dimensional 4 mm diameter concave hemisphere cavities. Six hundred and twenty five concave hemisphere cavities 24 are in a twenty five by twenty five linear pattern in the front light receiving surface of photovoltaic structure 22. Traditional flat solar panels often measure 100 mm (length)×100 mm (width)×1 mm (depth) with a photovoltaic surface area of 10,000 sq mm. The three-dimensional concave hemisphere panel shown in FIG. 2 measures 100 mm (length)×100 mm (width)×3 mm (depth, 1 mm of backing material plus 2 mm concave hemisphere cavity depth) and the PV surface area is 17,853 sq mm which is a 78.5% increase in photovoltaic capture surface while adding 2 mm in depth. In other words, a traditional solar semiconductor surface area is measured by length times width and therefore only an X and Y axis. Utilizing concave hemispheres increases surface area by incorporating a Z axis and results in 3D solar semiconductor structure. Depending on the size of the hemispheres, the additional depth of the panel is increased based on the radius of the hemisphere. A 4 mm diameter hemisphere adds 2 mm to the depth of the panel while an 8 mm diameter hemisphere adds 4 mm to the depth of the panel.

Figure 3:
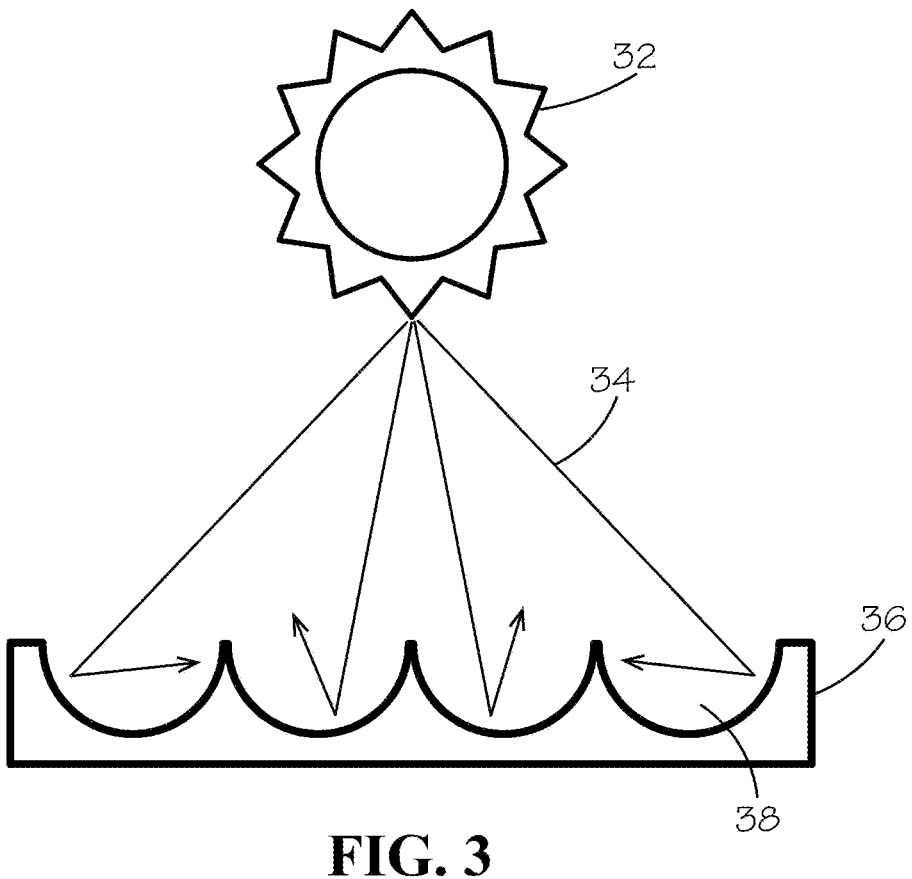
FIG. 3 is a cross-sectional view of a solar structure embodiment.

FIG. 3 is a cross-sectional view of the light capture of a photovoltaic solar structure having concave hemisphere cavities with the sun directly overhead. Sunlight 34 from sun 32 is directed into concave hemisphere cavities 38 of photovoltaic solar structure 36. As seen in FIG. 3, in direct sunlight the captured sunlight angles of concave hemisphere cavities are comparable to traditional flat photovoltaic panels. However, the added depth of the concave hemispheres on the light receiving side of the photovoltaic solar structure add significantly increased surface area and more energy may be captured.

Figure 4:
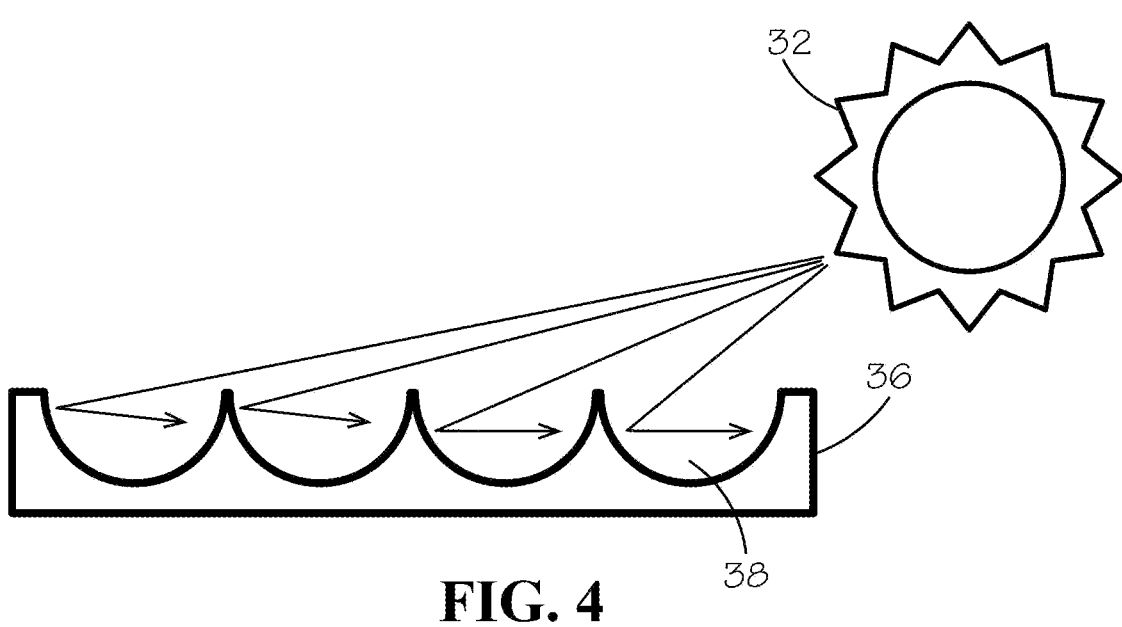
FIG. 4 is a cross-sectional view of the photovoltaic solar structure FIG. 3 with the sun at an angle.

FIG. 4 is a cross-sectional view of the light capture of the photovoltaic solar structure having concave hemisphere cavities of FIG. 3 with the sun at an angle. As seen in FIG. 4, with the sun at an angle, the concave curved hemisphere shape reflects light back onto photovoltaic material rather than reflecting light upwards as in a flat/planar photovoltaic structure. This light capturing advantage prolongs the benefit of solar capture over the course of a day without the need for sunlight trackers or rotating structures.

Thus, the disclosed solution maximizes photovoltaic material surface area, maximizes the reflectivity angles of light capture, and minimizes or otherwise negates the need for surface texturing and additional surface texture processing steps.

A common practice in modern solar cells is to apply a micro-texturing to the surface to refract light and create better absorption. However in the solution provided, sunlight is reflected onto the opposite side of the concave hemisphere such that there is no need for texturing. This eliminates a manufacturing step(s) and helps lower overall manufacturing costs.

Thin film solar cell fabrication and processing may be used to deposit photovoltaic semiconductor material onto a base substrate, for example using deposition processes such as chemical vapor deposition or physical vapor deposition (e.g., sputtering). The base substrate (e.g., glass, metal foil, plastic) for photovoltaic material deposition (e.g., silicon) has a concave hemisphere pattern (e.g., a molded concave hemisphere pattern) that is densely packed to maximize photovoltaic surface area. While the photovoltaic deposition material may have a layer thickness of only several nanometers, the base substrate may have a layer thickness of several millimeters. For smooth and consistently deposited photovoltaic material, the hemispheres are adequately large in order for the photovoltaic material to provide a uniform density on all surface areas. The depth of the panel is dependent on the size of the concave hemispheres (i.e., 6 mm diameter hemisphere adds 3 mm depth). In practice, the concave hemisphere diameter limits are in the range from 1 mm-100 mm and the most common range is 2 mm-10 mm. Considerations include the smoothness of the deposited surface desired.

Figure 5:
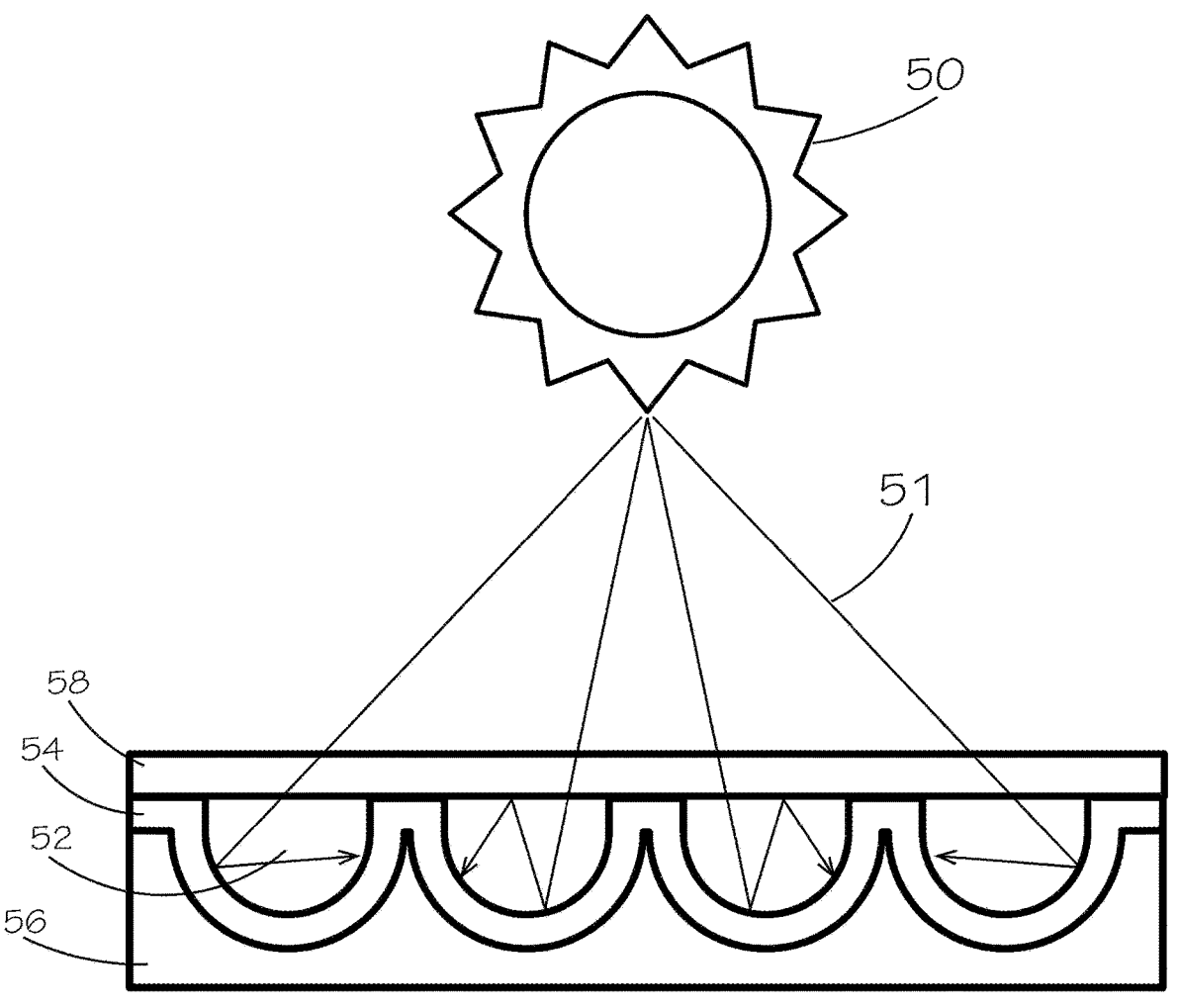
FIG. 5 is a cross sectional view of a thin film solar cell embodiment.

FIG. 5 is a cross sectional view of a thin film solar cell showing the photovoltaic solar cell substrate and the captured gas filled (e.g., air) pockets formed by the concave hemisphere cavities in the photovoltaic solar cells substrate and a top transparent layer. Photovoltaic solar cell substrate 54 is deposited on base substrate 56 thus forming concave hemisphere cavities 52. Top transparent cover 58 seals the air in concave hemisphere cavities 52 while allowing sunlight 51 from sun 50 through to photovoltaic solar cell substrate 54 and reflecting light from leaving the concave hemisphere cavity formed by photovoltaic solar cell substrate 54 and top transparent cover 58. This light is absorbed by photovoltaic solar cell substrate 54 or reflected within the concave hemisphere cavity formed by photovoltaic solar cell substrate 54 and top transparent cover 58.

Advantageously, the substantial planar top transparent cover may be a glass layer treated with an anti-reflective coating which helps further reduce reflections and increase absorption.

For example, a thin anti-reflective coating of silicon nitride or titanium oxide to reduce reflectivity from 4-6% down to 1-2%. Additionally, the anti-reflective coated glass on top of the hemisphere patterned substrate layer minimizes and prevents dust and moisture build up within the hemisphere cavities (dust and moisture buildup may negate the efficiency gains made).

Importantly, the space between the substantially planar top transparent cover and photovoltaic material created by the concave hemispheres cavities creates sealed air pockets that help to insulate the solar panel to avoid overheating and help the panel operate at maximum efficiency. These empty pockets may be filled with gasses such as ambient air, or inert gasses such as argon or krypton similar to modern day dual pane windows. The panels may be injected with argon or krypton gas to replace the air inside the cavities or sealed in an argon or krypton filled environment, for example an argon or krypton filled environment during the lamination process of a top transparent cover.

The top transparent cover (e.g., a glass anti-reflective coating layer), may advantageously seal the concave hemisphere cavities, the gas (or air) in the empty cavity both maximize light absorption within the cavity and provide insulation thus reducing heat build up. An inert gas such as argon or krypton, or alternatively xenon or nitrogen, may be added. The added gas replaces regular or ambient air and allows for less convection and helps minimize convective currents and reduce heat build up and heat transfer to further improve and optimize solar cell efficiency.

As shown in FIG. 5, the photovoltaic solar cell substrate has a substantially conformal backside (i.e., a three-dimensional backside surface of convex hemispheres) photovoltaic solar cell substrate conformal to the base substrate surface having a plurality of concave hemisphere cavities.

The most common type of solar panel is based on silicon wafers made from monocrystalline silicon or polycrystalline silicon. Monocrystalline cells traditionally offer the highest efficiency, however they are often more costly. Typical silicon wafer based panels consist of a backsheet base layer, a positive and negative silicon semiconductor, and a glass top cover with anti-reflective coating. To form concave hemisphere cavities for a silicon wafer based solar panel, laser etching may be used to remove silicon to form the concave hemisphere cavities in an adequately thick silicon wafer. While there are some uses of etching silicon wafer based solar cells, the focus tends to be on generating texture at the nanometer scale to better absorb light and not to create structured shapes and add depth to increase surface area.

Figure 6:
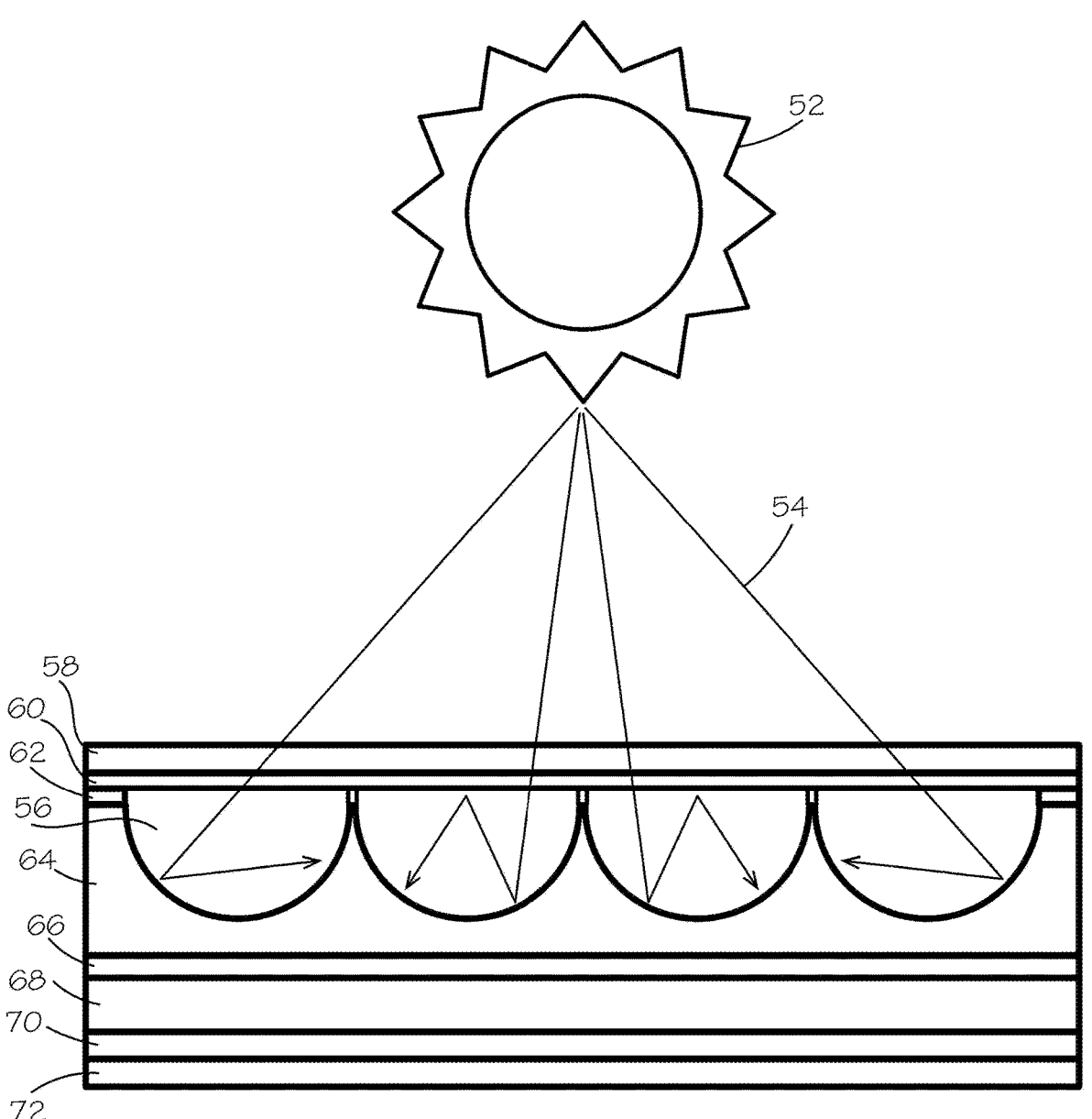
FIG. 6 is a cross sectional view of a solar panel embodiment.

FIG. 6 is a cross sectional view of a solar panel showing the layer stack of a photovoltaic cell and the captured air pockets formed by the concave hemisphere cavities in the photovoltaic solar cells substrate and a transparent anti-reflective coating glass layer. As shown in FIG. 5, the photovoltaic semiconductor layers have a substantially planar backside (i.e., a substantially planar non-light receiving side). Concave hemisphere cavities 56 are formed in p-type semiconductor layer 64. P-type semiconductor layer 64 is on p-n junction layer 66 which is on n-type semiconductor layer 68. Bottom electrode 70 is on n-type semiconductor layer 68, and backsheet 72 supports and seals the solar panel. Top electrode 62 is positioned on p-type semiconductor layer 64 including the ridges of p-type semiconductor layer 64 between concave hemisphere cavities 56. Anti-reflective coating 60 and hardened glass 58 seal the air cavities of concave hemisphere cavities 56 while allowing sunlight 54 from overhead sun 52 to pass through for absorption by the photovoltaic solar cell substrate.

FIG. 6 shows an example of a laser etched silicon wafer as a layer within a solar panel. Texturing is not essential as a significant portion of reflected light is bounced towards additional photovoltaic material and is captured. In addition, the top glass layer has an underlayer of anti-reflective material.

The disclosed subject matter may be advantageously structured and formed as thin film solar cells and panels using thin film photovoltaic materials such as silicon (Si) and materials such as CIGS (copper, indium, gallium, selenide) or Cd—Te (cadmium telluride) in addition to a-Si (amorphous silicon). Thin film photovoltaic solar cells have numerous disadvantages and in many cases unfortunately a bad reputation. Efficiency has been a tad lower compared to other mainstream solar cell structures and companies have perhaps tried to be too novel. For example this includes a focus on flexible panels, multi-step processes, and monolithic panels. It is a belief of the present inventors that thin film photovoltaics work best when the process and architecture are optimized for efficiency rather than flexibility. (e.g., leading thin film is now three-stage co-evaporation multi-layer insulation (MLI) on glass which has lower costs than standard c-si wafers). And while it is exciting to see rolls of thin flexible panels come off a manufacturing line, this is not a highly efficient process and 'flexible' panels appear to be a niche need that often cannot overcome efficiency and cost per watt concerns. Structural and formation innovations directed towards the optimization of efficiency and manufacturing of thin film cells are needed.

Deposition techniques to apply an evenly deposited layer of photovoltaic material on a base substrate may be utilized. This includes thin film deposition techniques such as evaporation, magnetron sputtering, ion beam sputtering, pulsed laser deposition. The standard, or as deposited, smooth surface of the photovoltaic material would not require additional texturing to absorb light as the refracted light would predominantly be re-captured when reflected in the hemisphere cavity.

Thus, the provided solution leverages lower cost deposition methods of thin film solar cells and increases captured energy with the same surface area through a concave hemisphere pattern having three-dimensional structure and increased depth. The solution provided pairs well with best practices of thin. Rim manufacturing of deposition on glass, aluminum and metal. The thin film solar cell deposition backing (also called base substrate) has the concave hemisphere pattern that the photovoltaic material is deposited on. The co-evaporation and co-deposition techniques pioneered by thin film manufacturers to apply photovoltaic materials to flexible substrates can be utilized on a molded shape substrate.

Traditionally, the thin film industry has focused on producing thin and flexible solar panels often using a plastic substrate so that the panels may be flexible. However, as manufacturing efficiencies have evolved, most thin film manufacturing has standardized on solid non-flexible panels. Due to the added three-dimensional depth of the solution provided herein, the panel would not be as flexible and would be slightly thicker than a traditional solar panel. However, it is anticipated an additional few millimeters of depth and lack of flexibility may not be a major deterrent for the majority of solar installations.

Thin film technologies involve depositing semiconductor photovoltaic material onto a base substrate often glass, metal foil or plastic. Typically, this involves beneficially lower costs but also detrimentally lower solar efficiency. Generally, there are three main types of thin film solar panels: amorphous silicon (a-Si), cadmium telluride (CdTe), and copper, indium, gallium, selenide (CIGS) or gallium free CIS.

Amorphous silicon (a-Si) uses a chemical vapor deposition to place a thin layer of silicon onto a base layer. By creating a base layer molded with concave hemispheres as described herein, the process of applying a chemical vapor deposition onto the base substrate would yield a concave hemisphere structure panel.

CIS and CIGS solar cells are produced using co-evaporation or co-deposition. Both techniques deposit a thin layer of semiconductor material onto a base substrate. Using molecules beyond silicon are possible with co-evaporation and co-deposition techniques and have significantly increased efficiency of thin film modules.

Thin film manufacturing is a widely used process in a variety of fields including electronics, medical, optics, led displays, optical filters, etc. The solar thin film deposition is the process of depositing a thin film semiconductor material onto a base substrate material. The solutions provided use thin film deposition to deposit semiconductive material onto a molded base substrate shaped to contain concave hemisphere patterns.

Figure 7:
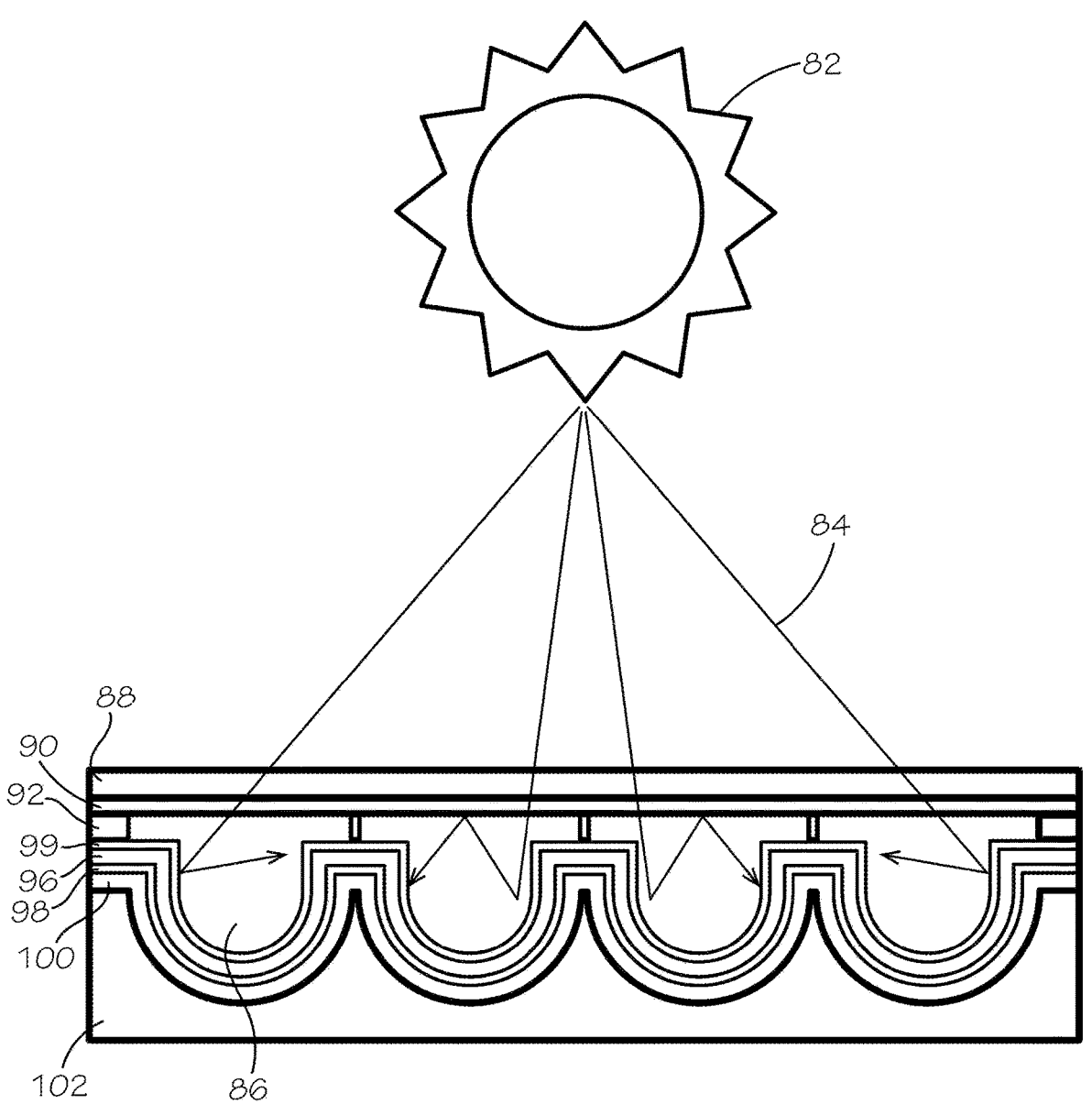
FIG. 7 is a cross sectional view of a thin film solar panel embodiment.

FIG. 7 is a cross sectional view of a thin film CIGS solar panel showing the layer stack of a photovoltaic cell and the captured air pockets formed by the concave hemisphere cavities in the photovoltaic solar cells substrate and a transparent anti-reflective coating glass layer. To form concave hemisphere cavities for a thin film based solar panel, the absorber layers are conformally deposited on a base substrate having concave hemisphere cavities. As shown in FIG. 6, the deposited photovoltaic semiconductor layers have a substantially conformal backside (i.e., a three-dimensional backside surface of convex hemispheres) conformal to the base substrate surface having a plurality of concave hemisphere cavities. Concave hemisphere cavities 86 are formed by deposited semiconductor layer 99. Deposited layer 99 (e.g., ZnO n-doped, 0.4-0.6 μm) is formed on deposited layer 96 (e.g., CdS n-doped 0.05 μm) which is formed on CIGS active absorber layer 98 (e.g., p-doped 2-4 μm) which is formed on bottom electrode 100 (e.g., Mo 1 μm) supported by molded base substrate 102 (e.g., glass, metal, plastic). Top electrode 92 is positioned on deposited semiconductor layer 99 including the ridges of deposited semiconductor layer 99 between concave hemisphere cavities 86. Anti-reflective coating 90 and hardened glass 88 seal the air cavities of concave hemisphere cavities 56 while allowing sunlight 84 from overhead sun 82 to pass through for absorption by the photovoltaic solar cell substrate.

FIG. 7 shows an example of a solar panel showing evaporative deposition of both positive and negative semiconductive material on concave hemisphere structure substrate. As shown, the photovoltaic semiconductor layers have a substantially 3D conformal backside (i.e., a substantially 3D conformal non-light receiving side). Unlike traditional wafers which would require a subtractive technique to etch concave hemispheres, thin film panels may use an additive deposition method to apply semiconductor material onto a molded base substrate. And texturing is not essential as a significant portion of reflected light is bounced towards additional photovoltaic material and is captured. In addition, the top glass layer has an underlayer of anti-reflective material.

By creating a molded base substrate to accommodate the three-dimensional concave hemispheres, the precise spacing and locations for metal contact fingers may be pre-determined and incorporated into the substrate. Metallization is typically applied by screen or stencil. printing. The goal for metallization is to generate low lateral resistance and narrow contact fingers. Surface texturing has a negative impact and increases resistance. The solution provided. uses a smooth surface which would allow for narrow contact fingers that minimize lateral resistance.

Figure 8:
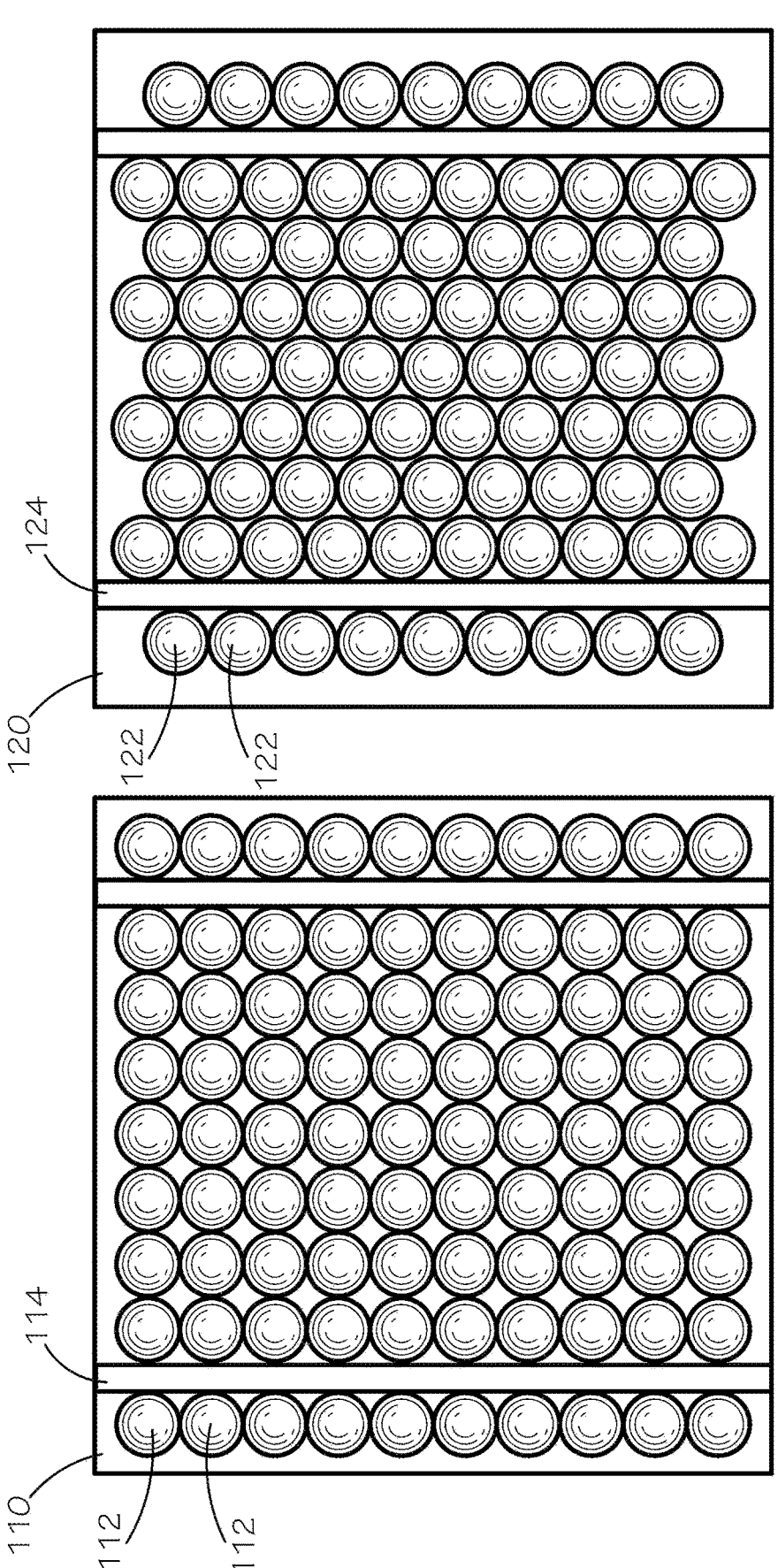
FIG. 8 are top views of a base substrate mold.

Contact areas may be incorporated into the structure to allow for appropriate metallization fingers and busbars. A smooth, non-textured surface allows for thinner and more efficient metallization. FIG. 8 shows top views of a base substrate mold accommodating contact metallization on both linear and staggered concave hemisphere patterns, such as that shown in FIGS. 1A through 1D. Areas for contact metallization 114 are positioned between the linear pattern of concave hemisphere cavities 112 in the front surface of base substrate mold 110. Areas for contact metallization 124 are positioned between the staggered pattern of concave hemisphere cavities 122 in the front surface of base substrate mold 120.

The concave hemisphere structures may be formed in the base substrate using a variety of methods that can be incorporated into traditional solar panel manufacturing. For instance, often a base substrate of aluminum is used for thin film solar manufacturing. The base aluminum substrate may be thermoformed, pressed or molded to create sheets or rolls of backing to incorporate the three dimensional hemisphere structure. Thus the hemisphere layer may be used independently with a concave backing or adhered to another base layer creating a flat planar surface on the non-light receiving side.

Figure 9:
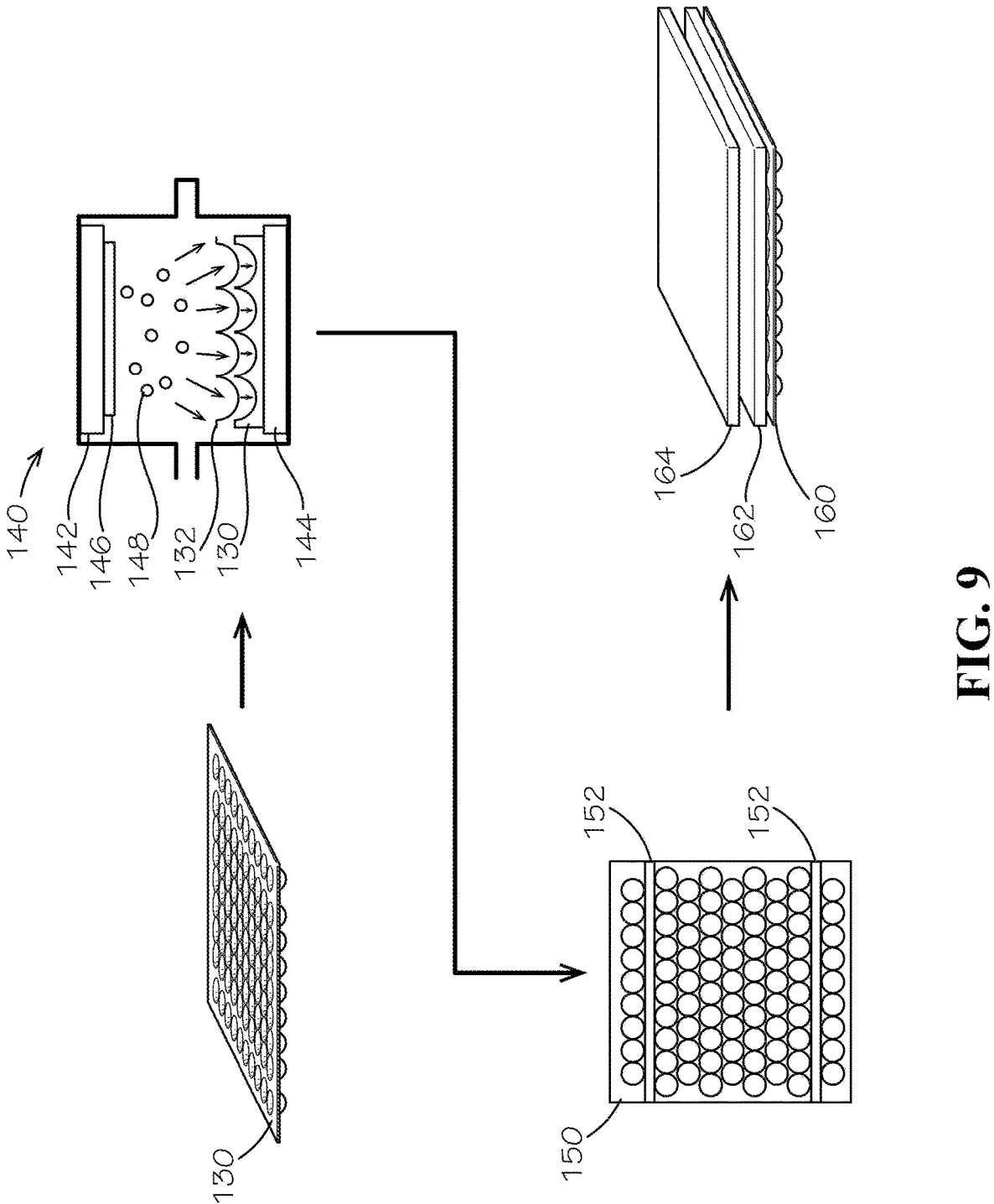
FIG. 9 is a schematic representation of a process flow embodiment for the formation of a photovoltaic solar cell.

FIG. 9 is a schematic representation of a process flow for the formation of a photovoltaic solar cell having a three-dimensional concave hemisphere structure and using a base substrate and evaporative deposition processing to apply photovoltaic layers to the base substrate. After photovoltaic layer deposition, top (front) metallization is formed and a top cover of glass with anti-reflective coating is applied. Magnetron sputtering tool 140 deposits photovoltaic layers 132 on base substrate 130 having concave hemisphere front surface structures and convex back surface structures. Sputtered targets 148 from sputtering target 146 on cathode 142 are deposited as photovoltaic layers 132 on base substrate 130 on anode 144. Metallization contacts 152 are then applied to the top surface of base substrate with semiconductor layers 150. Top protective layer 164 with anti-reflective coating 162 is then applied (e.g., laminated or otherwise glued in an insulative gas filled environment) to the top surface of base substrate with semiconductor layers and metallization 160.

Figure 10:
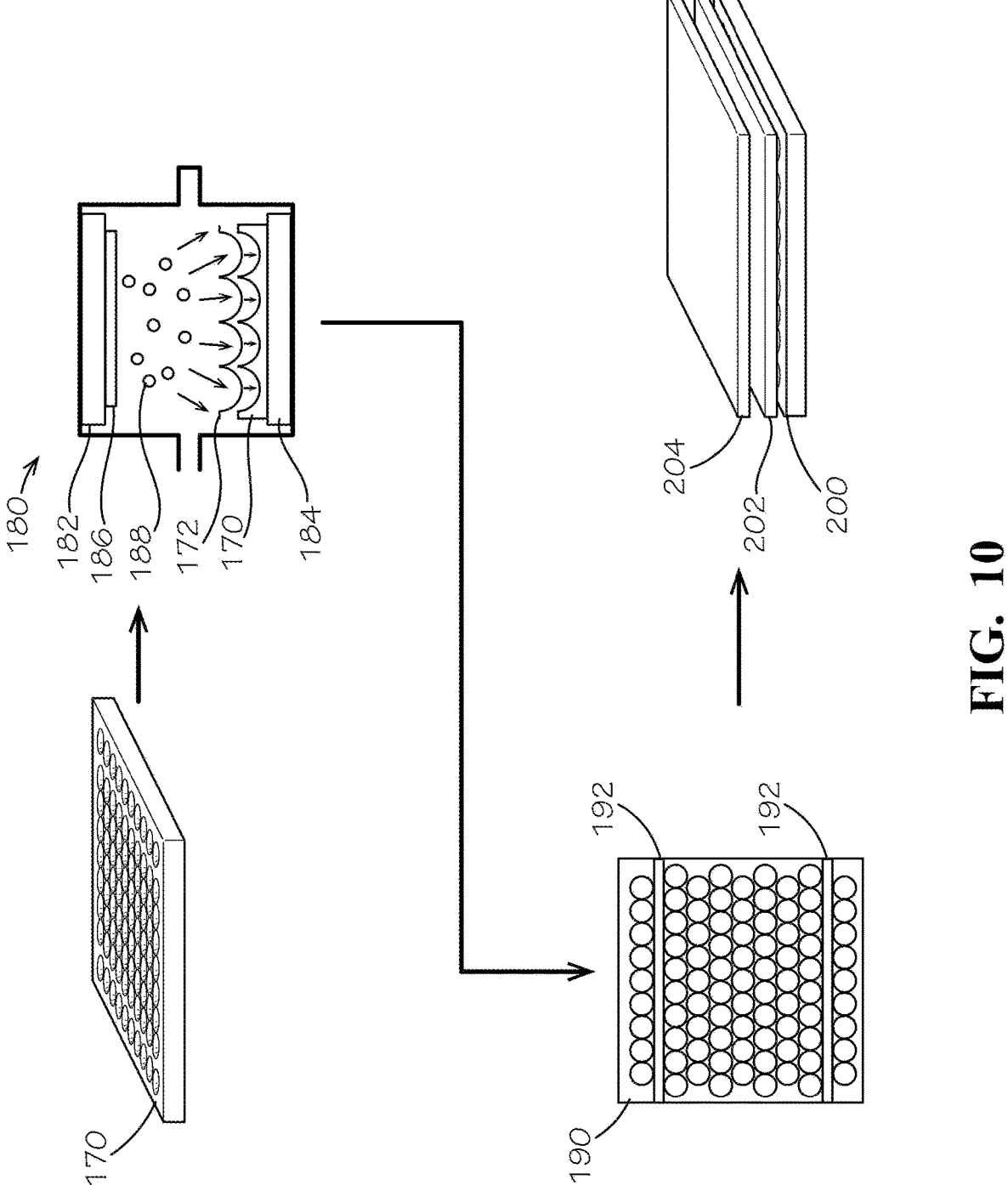
FIG. 10 is a schematic representation of a process flow embodiment for the formation of a photovoltaic solar cell.

FIG. 10 is a schematic representation of a process flow for the formation of a photovoltaic solar cell having a three-dimensional concave hemisphere structure and using a base substrate and evaporative deposition processing to apply photovoltaic layers to the base substrate. After photovoltaic layer deposition, top (front) metallization is formed and a top cover of glass with anti-reflective coating is applied. Magnetron sputtering tool 180 deposits photovoltaic layers 172 on base substrate 170 having concave hemisphere front surface structures and planar back surface. Sputtered targets 188 from sputtering target 186 on cathode 182 are deposited as photovoltaic layers 172 on base substrate 170 on anode 184. Metallization contacts 192 are then applied to the top surface of base substrate with semiconductor layers 190. Top protective layer 204 with anti-reflective coating 202 is then applied (e.g., laminated or otherwise glued in an insulative gas filled environment) to the top surface of base substrate with semiconductor layers and metallization 200.

The process flows of FIGS. 9 and 10 show a formed base substrate with incorporated concave hemispheres and photovoltaic material applied using an evaporative deposition method to apply a nano coating of photovoltaic material to the base substrate. The base substrate has a thickness to accommodate an evenly formed concave hemisphere structure in the range of 100-500 micrometers, while the evaporative deposited layers are several nanometers in thickness, similar to traditional thin film panels. Evaporation methods include physical vapor deposition (PVD), electron beam evaporation, ion assisted deposition, thermal evaporation, and magnetron sputtering. Physical vapor deposition (PVD) involves vaporizing a solid material in a vacuum and then depositing the vaporized material onto a substrate.

Figure 11:
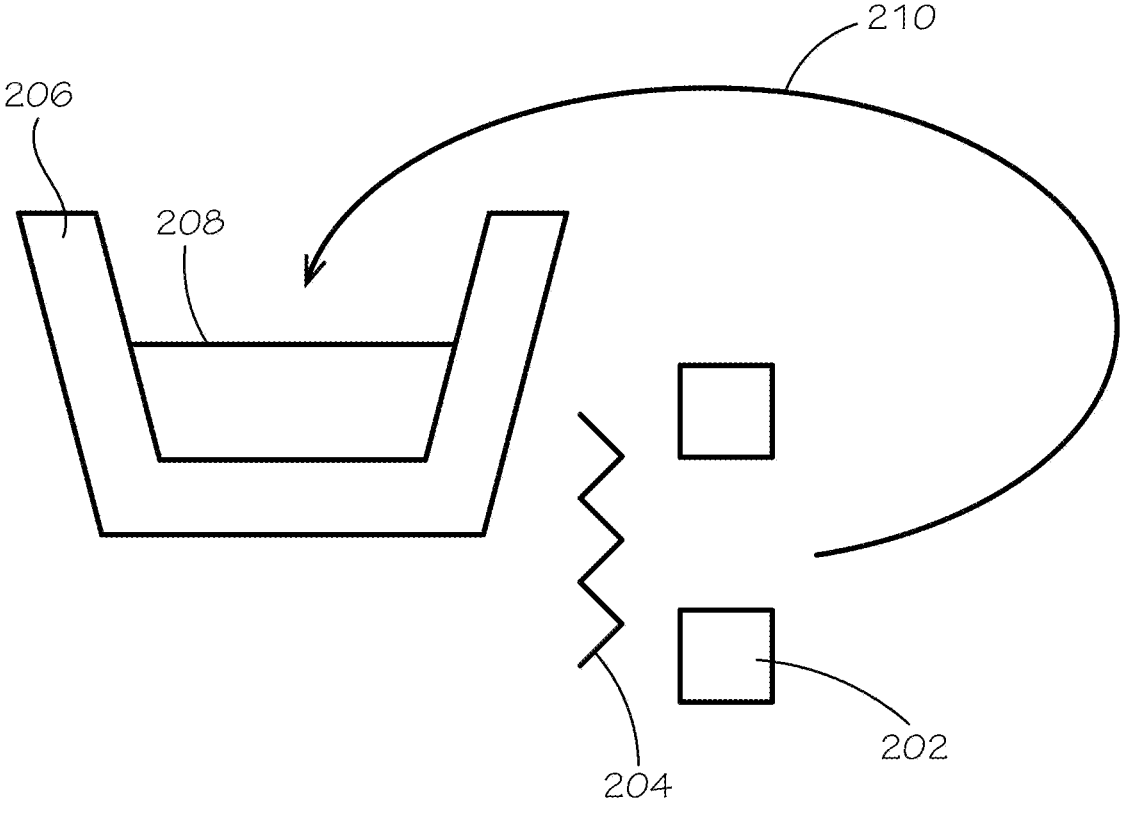
FIG. 11 is a diagram describing an electron beam evaporation process and tool.

Electron beam evaporation may be used to apply photovoltaic source material to a base substrate. FIG. 11 is a diagram describing an electron beam evaporation process and tool having cathode filament 204, magnetic lens 202, crucible 206 (e.g., water cooled copper crucible), and source material 208. Magnetic lens 202 focuses and positions highly charged electron beam 210 into source material 208 in crucible 206. Source material 208 evaporated by electron beam 210 is deposited onto the base substrate and the atoms formed create a thin film.

Figure 12:
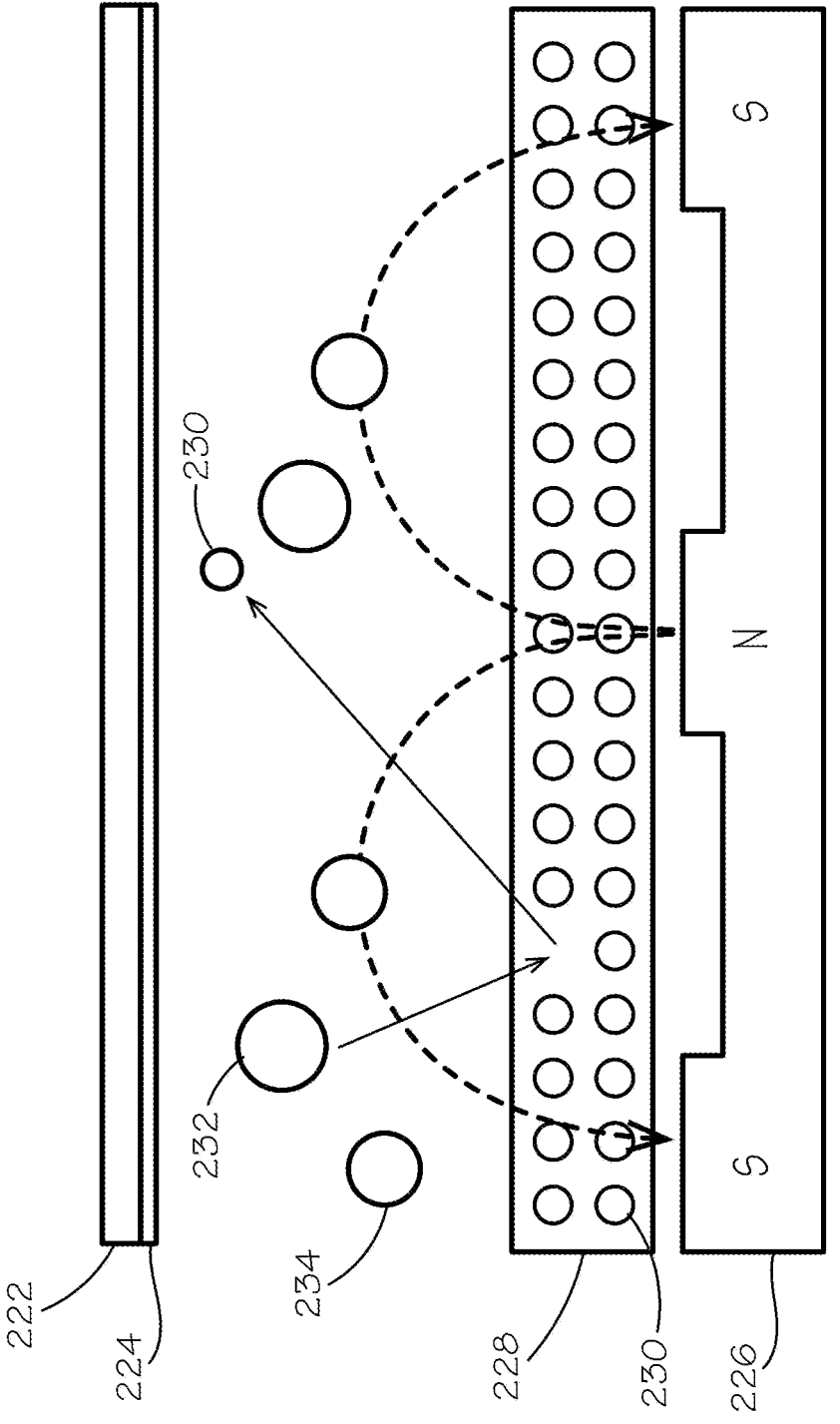
FIG. 12 is a diagram describing a magnetron sputtering process and tool.

Magnetron sputtering may be used to apply photovoltaic source material to a base substrate. Magnetron sputtering uses magnetically confined plasma near the semiconductor material and ions collide with the material and are deposited onto the base substrate. FIG. 12 is a diagram describing a magnetron sputtering process and tool having sputtering target 228 with sputtering atoms 230 on cathode 226. Plasma ions 232 (e.g., Ar+) are magnetized by magnetic field 234 to collide with target material 230 and eject target atoms 230 for deposition in a photovoltaic thin film onto base substrate 224 on anode 222.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A photovoltaic solar structure, comprising:
   a photovoltaic solar cell substrate having a light receiving surface and a back surface opposite said light receiving surface, said light receiving surface having a plurality of gas filled concave hemisphere cavities, said gas filled concave hemisphere cavities having a depth and a radius of one millimeter or greater; and,
   a substantially planar transparent cover sealing said plurality of gas filled concave hemisphere cavities.

2. The photovoltaic solar structure of claim 1, wherein said gas of said plurality of gas filled concave hemisphere cavities is ambient air.

3. The photovoltaic solar structure of claim 1, wherein said gas of said plurality of gas filled concave hemisphere cavities is an inert gas.

4. The photovoltaic solar structure of claim 1, wherein said gas of said plurality of gas filled concave hemisphere cavities is argon.

5. The photovoltaic solar structure of claim 1, wherein said gas of said plurality of gas filled concave hemisphere cavities is krypton.

6. The photovoltaic solar structure of claim 1, wherein said photovoltaic solar cell substrate is a thin film photovoltaic solar cell substrate.

7. The photovoltaic solar structure of claim 6, wherein said thin film photovoltaic solar cell substrate is positioned on a surface of a base substrate mold having a plurality of concave hemisphere cavities having a depth and a radius of one millimeter or greater.

8. The photovoltaic solar structure of claim 1, wherein said back surface of said photovoltaic solar cell substrate is substantially planar.

9. The photovoltaic solar structure of claim 1, wherein said substantially planar transparent cover has an anti-reflective coating.

10. The photovoltaic solar structure of claim 9, wherein said anti-reflective coating is on the backside of said substantially planar transparent cover.

11. The photovoltaic solar structure of claim 1, wherein said plurality of gas filled concave hemisphere cavities are arranged in a linear pattern.

12. The photovoltaic solar structure of claim 1, wherein said plurality of gas filled concave hemisphere cavities are arranged in a staggered pattern.

13. The photovoltaic solar structure of claim 1, further comprising contact metallization on ridges between said plurality of gas filled concave hemisphere cavities on said light receiving surface of said photovoltaic solar cell substrate.

14. A photovoltaic solar structure, comprising:
    a thin film photovoltaic solar cell substrate positioned on a surface of a base substrate mold having a plurality of concave hemisphere cavities having a depth and a radius of two millimeters or greater, said thin film photovoltaic solar cell substrate having a light receiving surface and a back surface opposite said light receiving surface, said light receiving surface having a plurality of gas filled concave hemisphere cavities, said gas filled concave hemisphere cavities having a depth and a radius of two millimeters or greater;

a substantially planar transparent cover sealing said plurality of gas filled concave hemisphere cavities, and said substantially planar transparent cover having a backside anti-reflective coating; and contact metallization on ridges between said plurality of gas filled concave hemisphere cavities on said light receiving surface of said thin film photovoltaic solar cell substrate.

15. The photovoltaic solar structure of claim 14, wherein said gas of said plurality of gas filled concave hemisphere cavities is ambient air.

16. The photovoltaic solar structure of claim 14, wherein said gas of said plurality of gas filled concave hemisphere cavities is an inert gas.

17. The photovoltaic solar structure of claim 14, wherein said gas of said plurality of gas filled concave hemisphere cavities is argon.

18. The photovoltaic solar structure of claim 14, wherein said gas of said plurality of gas filled concave hemisphere cavities is krypton.

19. The photovoltaic solar structure of claim 14, wherein said plurality of gas filled concave hemisphere cavities are arranged in a linear pattern.

20. The photovoltaic solar structure of claim 14, wherein said plurality of gas filled concave hemisphere cavities are arranged in a staggered pattern.

* * * * *